(12) United States Patent
Kim et al.

(10) Patent No.: US 11,827,650 B2
(45) Date of Patent: Nov. 28, 2023

(54) METHOD OF MANUFACTURING RUTHENIUM-CONTAINING THIN FILM AND RUTHENIUM-CONTAINING THIN FILM MANUFACTURED THEREFROM

(71) Applicant: DNF CO., LTD., Daejeon (KR)

(72) Inventors: Myong Woon Kim, Daejeon (KR); Sang Ick Lee, Daejeon (KR); Sung Woo Cho, Daegu (KR); Mi Jeong Han, Daejeon (KR); Haeng Don Lim, Daejeon (KR)

(73) Assignee: DNF CO., LTD., Daejeon (KR)

(*) Notice: Subject to any disclaimer, the term of this patent is extended or adjusted under 35 U.S.C. 154(b) by 142 days.

(21) Appl. No.: 16/760,417

(22) PCT Filed: Nov. 1, 2018

(86) PCT No.: PCT/KR2018/013160
§ 371 (c)(1),
(2) Date: Apr. 29, 2020

(87) PCT Pub. No.: WO2019/088722
PCT Pub. Date: May 9, 2019

(65) Prior Publication Data
US 2020/0339617 A1 Oct. 29, 2020

(30) Foreign Application Priority Data
Nov. 1, 2017 (KR) .................... 10-2017-0144420
Oct. 31, 2018 (KR) .................... 10-2018-0131423

(51) Int. Cl.
| | |
|---|---|
| C07F 15/00 | (2006.01) |
| C23C 16/18 | (2006.01) |
| H01L 21/02 | (2006.01) |
| H01L 21/3205 | (2006.01) |
| C23C 16/455 | (2006.01) |
| C23C 16/50 | (2006.01) |
| C23C 16/56 | (2006.01) |
| H01L 21/285 | (2006.01) |
| H01L 21/768 | (2006.01) |

(52) U.S. Cl.
CPC .......... *C07F 15/0046* (2013.01); *C23C 16/18* (2013.01); *C23C 16/45527* (2013.01); *C23C 16/45536* (2013.01); *C23C 16/45553* (2013.01); *C23C 16/50* (2013.01); *C23C 16/56* (2013.01); *H01L 21/0228* (2013.01); *H01L 21/285* (2013.01); *H01L 21/28556* (2013.01); *H01L 21/32051* (2013.01); *H01L 21/76843* (2013.01)

(58) Field of Classification Search
None
See application file for complete search history.

(56) References Cited

U.S. PATENT DOCUMENTS

| | | | | |
|---|---|---|---|---|
| 6,074,945 A | * | 6/2000 | Vaartstra | ........... H01L 21/28556 438/681 |
| 7,041,596 B1 | * | 5/2006 | Dalton | ................ C23C 16/0245 257/E21.17 |
| 2017/0226638 A1 | * | 8/2017 | Han | ........................ C23C 16/06 |
| 2018/0282866 A1 | * | 10/2018 | Park | .................... C07F 15/0046 |

FOREIGN PATENT DOCUMENTS

| | | |
|---|---|---|
| CN | 102639548 A | 8/2012 |
| JP | 2001234347 A | 8/2001 |
| JP | 2002523907 A | 7/2002 |
| KR | 20100064082 A | 6/2010 |
| KR | 20130043557 A | 4/2013 |
| KR | 20140131219 A | 11/2014 |
| KR | 101636491 B1 | 7/2016 |
| TW | 504521 B | 10/2002 |
| TW | 201317245 A | 5/2013 |
| WO | WO-2014178684 A1 * | 11/2014 .......... C07F 15/0046 |

OTHER PUBLICATIONS

Kim, J. J. et al. Surface roughness reducing effect of iodine sources (CH3I,C2HSI) on Ru and RuO2 composite films grown by MOCVD. Thin Solid Films. vol. 409, 2002, pp. 28-32 (Year: 2002).*
Chemical Book. "Bis(Cyclopentadienyl) Ruthenium" (2017). Retrieved from https://www.chemicalbook.com/ChemicalProductProperty_EN_CB6673725.htm (Year: 2017).*
Kim, J. et al., "Surface roughness reducing effect of iodine sources (CH3I, C2H5I) on Ru and RuO2 composite films grown by MOCVD," Thin Solid Films, vol. 409, No. 1, Apr. 22, 2002, 5 pages.
ISA Korean Intellectual Property Office, International Search Report Issued in Application No. PCT/KR2018/013160, dated Feb. 25, 2019, 4 pages.
Japanese Patent Office, Office Action Issued in Application No. 2020-543444, dated Sep. 21, 2021, 12 pages. (Submitted with Machine Translation).
Korean Intellectual Property Office, Grant of Patent Issued in Application No. 2018-0131423, dated Mar. 3, 2022, 7 pages.
Taiwan Intellectual Property Office, Office Action Issued in Application No. 107138627, dated Mar. 14, 2022, 11 pages.
Japanese Patent Office, Office Action Issued in Application No. 2020-543444, dated Apr. 18, 2022, 6 pages.

* cited by examiner

*Primary Examiner* — Jose I Hernandez-Kenney
(74) *Attorney, Agent, or Firm* — McCoy Russell LLP

(57) ABSTRACT

Provided are a method of manufacturing a ruthenium-containing thin film and a ruthenium-containing thin film manufactured therefrom, and the method of manufacturing a ruthenium-containing thin film of the present invention uses a ruthenium(0)-based hydrocarbon compound and specific reaction gas, whereby a high-purity thin film may be easily manufactured by a simple process.

6 Claims, 8 Drawing Sheets

METHOD OF MANUFACTURING RUTHENIUM-CONTAINING THIN FILM AND RUTHENIUM-CONTAINING THIN FILM MANUFACTURED THEREFROM

CROSS-REFERENCE TO RELATED APPLICATIONS

The present application is a U.S. National Phase of International Patent Application Serial No. PCT/KR2018/013160 entitled "METHOD FOR PRODUCING RUTHENIUM-CONTAINING THIN FILM, AND RUTHENIUM CONTAINING THIN FILM PRODUCED THEREBY," filed on Nov. 1, 2018. International Patent Application Serial No. PCT/KR2018/013160 claims priority to Korean Patent Application No. 10-2017-0144420 filed on Nov. 1, 2017 and Korean Patent Application No. 10-2018-0131423 filed on Oct. 31, 2018. The entire contents of each of the above-referenced applications are hereby incorporated by reference for all purposes.

TECHNICAL FIELD

The following disclosure relates to a method of manufacturing a ruthenium-containing thin film, and a ruthenium-containing thin film manufactured therefrom, and more particularly, to a method of manufacturing a ruthenium-containing thin film by reacting a ruthenium(0)-based hydrocarbon compound as a precursor for depositing a thin film with iodine, alkyl iodide, silyl iodide or a mixture thereof which is specific reaction gas, and a ruthenium-containing thin film manufactured therefrom.

BACKGROUND

Recently, various metal, non-metal or transition metal compounds have been used, as a thin film electrode materials of a semiconductor device.

Among them, metal ruthenium or ruthenium oxide is widely used in a semiconductor device, due to low resistance, a high work function and thermal/chemical stability. In particular, metal ruthenium has better electrical properties than ruthenium oxide, and is preferred as a thin film electrode materials of a semiconductor device.

Accordingly, a ruthenium (Ru) thin film is used as a seed layer in a wiring structure of a semiconductor device, or an electrode such as a gate or a capacitor or the like of a transistor, or the like, as the semiconductor device is highly integrated and miniaturized, the ruthenium thin film used in the semiconductor device is also required to have improved uniformity and coatability.

Meanwhile, as a thin film deposition method in a semiconductor device, methods using molecular beam epitaxy (MBE), chemical vapor deposition (CVD), physical vapor deposition (PVD), or the like have been studied. Recently, as the quantity of a semiconductor devices is reduced and a design rule is decreased, as a deposition method satisfying a low temperature process, precise thickness control, uniformity of the thin film and coatability, thin film formation using atomic layer deposition (ALD) according to self-limiting surface reaction mechanism has been widely studied.

Regarding the method of manufacturing a ruthenium thin film using atomic layer deposition, conventionally $Ru(OD)_3$ [tris(2,4-octanedionato)Ruthenium(III)], $Ru(EtCP)_2$ [bis(ethylcyclopentadienyl) Ruthenium(II)], or the like was applied as a ruthenium raw material. However, among them, $Ru(OD)_3$ contains oxygen, so that pure ruthenium is hard to be deposited on a reaction substrate, and furthermore, there is a problem in that $RuO_x$ is formed on a portion of the substrate.

In addition, in the case of $Ru(EtCP)_2$, due to the nature of cyclopentadiene series, a ruthenium atom has difficulty in breaking a chemical bond and being independently present, which causes an excessive amount of impurities to remain on a ruthenium thin film, and also, since the decomposition thereof is not easy. Accordingly, there is a problem that a process of depositing a $RuO_2$ film by using $O_2$ plasma and then reducing it by using $H_2$ is required to obtain a Ru film. Thus, in the case of the Ru(0) compound, an amount of the reaction gas $O_2$ is adjusted to reduce formation of the thin film of $RuO_x$, but the problem is still not solved.

Accordingly, there is demanded a method of manufacturing a high-purity ruthenium-containing thin film by reducing a content of impurities in the thin film by a simple process.

RELATED DOCUMENTS

Patent Documents

Korean Patent Registration No. 10-1636491

SUMMARY

An embodiment of the present invention is directed to providing a method of manufacturing a ruthenium-containing thin film using a ruthenium(0)-based hydrocarbon compound as a precursor for depositing a ruthenium-containing thin film and using a certain reaction gas, and a ruthenium-containing thin film manufactured therefrom.

Another embodiment of the present invention is directed to providing a composition for depositing a ruthenium-containing thin film including a ruthenium(0)-based hydrocarbon compound and certain reaction gas.

The present invention is to provide a method of manufacturing a high-purity ruthenium-containing thin film by a simple process, by using a ruthenium(0)-based hydrocarbon compound as a precursor and using a specific reaction gas.

In one general aspect, a method of manufacturing a ruthenium-containing thin film includes:
  using a ruthenium(0)-based hydrocarbon compound as a precursor for depositing a thin film, and
  iodine, (C1-C3)alkyl iodide, silane iodide, or a mixture thereof as reaction gas to manufacture the ruthenium-containing thin film.

The method of manufacturing a ruthenium-containing thin film according to an exemplary embodiment of the present invention may be performed by atomic layer deposition (ALD), chemical vapor deposition (CVD), metalorganic chemical vapor deposition (MOCVD), low pressure chemical vapor deposition (LPCVD), plasma-enhanced chemical vapor deposition (PECVD), or plasma-enhanced atomic layer deposition (PEALD).

Preferably, the method of manufacturing a ruthenium-containing thin film according to an exemplary embodiment of the present invention may include:
  a) maintaining a temperature of a substrate mounted in a chamber to 80 to 500° C.;
  b) injecting carrier gas and the ruthenium(0)-based hydrocarbon compound; and
  c) injecting reaction gas which is iodine, (C1-C3)alkyl iodide, silane iodide, or a mixture thereof to manufacture the ruthenium-containing thin film on the substrate.

Preferably, the reaction gas according to an exemplary embodiment of the present invention may be used at 0.1 to 200 mol, based on 1 mol of the ruthenium(0)-based hydrocarbon compound.

The method of manufacturing a ruthenium-containing thin film according to an exemplary embodiment of the present invention may further include a step of heat treatment after step c), and the heat treatment may be performed at 200 to 700° C.

Preferably, the ruthenium(0)-based hydrocarbon compound according to an exemplary embodiment of the present invention may be represented by the following Chemical Formula 1:

[Chemical Formula 1]

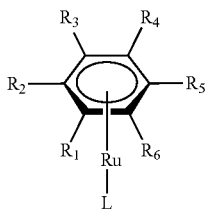

wherein

L is a neutral ligand having 1 to 4 double bonds which is one compound selected from the group consisting of an acyclic alkene compound having 2 to 10 carbon atoms, a cyclic alkene compound having 3 to 10 carbon atoms, an acyclic or cyclic heteroalkene like structure compound having 2 to 8 carbon atoms containing 1 to 4 heteroatoms selected from nitrogen and oxygen, and a carbonyl group-containing compound; and $R_1$ to $R_6$ are independently of one another hydrogen or (C1-C7)alkyl.

More preferably, the ruthenium(0)-based hydrocarbon compound according to an exemplary embodiment of the present invention may be represented by the following Chemical Formula 1-1 or 1-2:

[Chemical Formula 1-1]

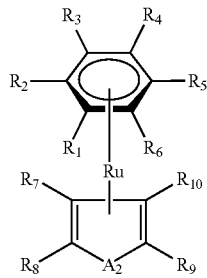

[Chemical Formula 1-2]

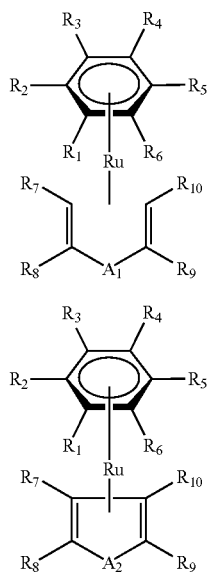

wherein $R_1$ to $R_{10}$ are independently of one another hydrogen or (C1-C7)alkyl;

$A_1$ is a single bond or $-(CR_{11}R_{12})_m-$ in which $R_{11}$ and $R_{12}$ are independently of each other hydrogen or (C1-C7)alkyl, and m is an integer of 1 to 3; and $A_2$ is $-(CR_{11}R_{12})_n-$ in which $R_{11}$ and $R_{12}$ are independently of each other hydrogen or (C1-C7)alkyl, and n is an integer of 1 to 3.

Preferably, the ruthenium(0)-based hydrocarbon compound according to an exemplary embodiment of the present invention may be represented by the following Chemical Formula 2 or 3:

[Chemical Formula 2]

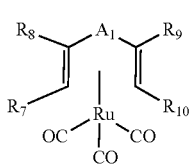

[Chemical Formula 3]

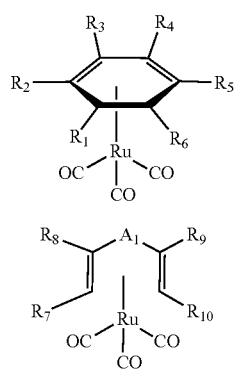

wherein $R_1$ to $R_6$ are independently of one another hydrogen or (C1-C7)alkyl;

$R_7$ to $R_{10}$ are independently of one another hydrogen or (C1-C7)alkyl; and $A_1$ is a single bond or $-(CR_{11}R_{12})_m-$ in which $R_{11}$ and $R_{12}$ are independently of each other hydrogen or (C1-C7)alkyl, and m is an integer of 1 to 3.

Preferably, the reaction gas according to an exemplary embodiment of the present invention may be $I_2$, $CH_3I$, $CH_2I_2$, $CHI_3$, $CH_3CH_2I$, $CH_3CHI_2$, $ICH_2CH_2I$, $CH_3CH_2CH_2I$, $CH_3CHICH_3$, $ICH_2CH_2CH_2$, or $SiH_2I_2$, and the carrier gas may be any one or a mixture of two or more selected from the group consisting of nitrogen ($N_2$), hydrogen, argon, and helium.

In another general aspect, a composition for depositing a ruthenium-containing thin film includes a ruthenium(0)-based hydrocarbon compound and reaction gas which is iodine, (C1-C30)alkyl iodide, silane iodide, or a mixture thereof.

Preferably, the reaction gas according to an exemplary embodiment of the composition for depositing a ruthenium-containing thin film of the present invention may be used at 0.1 to 200 mol, based on 1 mol of the ruthenium(0)-based hydrocarbon compound, and the ruthenium(0)-based hydrocarbon compound may be any one or a mixture of two or more selected from the group consisting of ruthenium(0)-based hydrocarbon compounds represented by Chemical Formulae 1, 2 and 3.

Preferably, the reaction gas according to an exemplary embodiment of the composition for depositing a ruthenium-containing thin film of the present invention may be $I_2$, $CH_3I$, $CH_2O_2$, $CHI_3$, $CH_3CH_2I$, $CH_3CHI_2$, $ICH_2CH_2I$, $CH_3CH_2CH_2I$, $CH_3CHICH_3$, $ICH_2CH_2CH_2$, or $SiH_2I_2$.

In still another general aspect, a ruthenium-containing thin film is manufactured using the composition for depositing a ruthenium-containing thin film according to an exemplary embodiment of the present invention, and the manufactured ruthenium-containing thin film may have a specific resistance of 100 Ω·cm or less and an oxygen content of 3 at % or less.

Preferably, the ruthenium-containing thin film of the present invention according to an exemplary embodiment of the present invention may have a carbon content of 3 at % or less.

Other features and aspects will be apparent from the following detailed description, the drawings, and the claims.

DETAILED DESCRIPTION OF EMBODIMENTS

Figure 1:
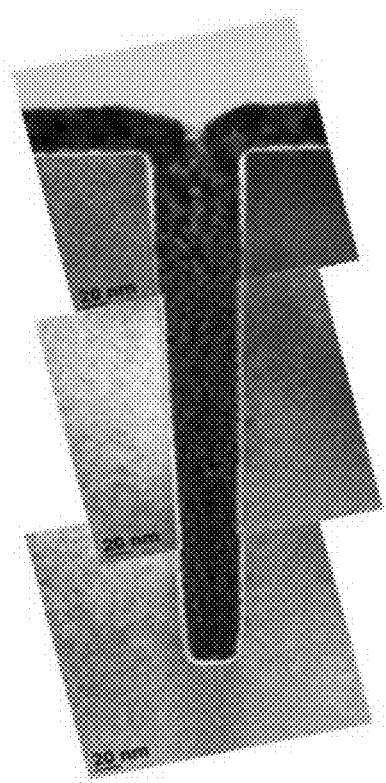
FIG. 1 is a drawing illustrating the result of a gap-fill by TEM analysis of the ruthenium thin film of Example 1 after heat-treating the ruthenium thin film under hydrogen atmosphere.

The advantages, features and aspects of the present invention will become apparent from the following description of the embodiments with reference to the accompanying drawings, which is set forth hereinafter. The present invention may, however, be embodied in different forms and should not be construed as limited to the embodiments set forth herein. Rather, these embodiments are provided so that this disclosure will be thorough and complete, and will fully convey the scope of the present invention to those skilled in the art. The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Hereinafter, exemplary embodiments will be described in detail with reference to the accompanying drawings.

Hereinafter, a method of manufacturing a ruthenium-containing thin film, a composition for depositing a ruthenium-containing thin film, and a ruthenium-containing thin film manufactured therefrom of the present invention will be described, however, technical terms and scientific terms used herein have the general meaning understood by those skilled in the art to which the present invention pertains unless otherwise defined, and a description for the known function and configuration obscuring the present invention will be omitted in the following description.

"Alkyl" and other substituents containing an "alkyl" moiety described in the present specification include both straight chain or branched chain forms, and have 1 to 10 carbon atoms, preferably 1 to 7, more preferably 1 to 3 carbon atoms.

In addition, an "alkene compound" described in the present specification which is an acyclic or cyclic hydrocarbon compound, is an organic radical derived from hydrocarbon containing one or more double bonds.

"Heteroalkene-like compound" which is an alkene compound containing one or more heteroatoms in an alkene compound may be an acyclic or cyclic, in which the heteroatom may be selected from the group consisting of nitrogen, oxygen, sulfur, phosphorus, and the like, however, may be preferably oxygen or nitrogen, and may contain one or two or more of oxygen or nitrogen.

A carbonyl-containing compound described in the present specification may be used as a ligand of a ruthenium(0)-based hydrocarbon compound, and may be any compound having a carbonyl group, however, as a preferred example, the carbonyl-containing compound may be CO or acetylacetonate, but not limited thereto.

The present invention uses a ruthenium(0)-based hydrocarbon compound as a precursor, and specific reaction gas has that is iodine, (C1-C3)alkyl iodide, silane iodide, or a mixture thereof, whereby a separate reduction process is not needed, so that a method of manufacturing a high-purity ruthenium-containing thin film by a simple process is provided. A thin film having a uniform surface at a thin film thickness of 2 nm or less may be manufactured, and a high step coverage and a gap-fill without void are allowed.

The method of manufacturing a ruthenium-containing thin film of the present invention includes:

using a ruthenium(0)-based hydrocarbon compound as a precursor for depositing a thin film, and iodine, (C1-C3)alkyl iodide, silane iodide, or a mixture thereof as reaction gas to manufacture the ruthenium-containing thin film.

The method of manufacturing a ruthenium-containing thin film of the present invention does not use oxygen which is conventionally used reaction gas, whereby a high-purity thin film may be manufactured, and a separate reduction process for removing oxygen contained by a simple process.

The method of manufacturing a ruthenium-containing thin film according to an exemplary embodiment of the present invention may be performed by atomic layer deposition (ALD), chemical vapor deposition (CVD), metalorganic chemical vapor deposition (MOCVD), low pressure chemical vapor deposition (LPCVD), plasma-enhanced chemical vapor deposition (PECVD), or plasma-enhanced atomic layer deposition (PEALD), and in terms of having high purity and excellent physical properties, preferably atomic layer deposition (ALD) or chemical vapor deposition (CVD).

The method of manufacturing a ruthenium-containing thin film of the present invention is not limited, as long as the method is a method of reacting a ruthenium(0)-based hydrocarbon compound as a precursor with reaction gas which is iodine, (C1-C3)alkyl iodide, silane iodide, or a mixture thereof to manufacture a ruthenium-containing thin film, however, preferably, the method of manufacturing a ruthenium-containing thin film according to an exemplary embodiment of the present invention may include:

a) maintaining a temperature of a substrate mounted in a chamber to 80 to 500° C.;
b) injecting carrier gas and the ruthenium(0)-based hydrocarbon compound; and
c) injecting reaction gas which is iodine, (C1-C3)alkyl iodide, silane iodide, or a mixture thereof to manufacture the ruthenium-containing thin film on the substrate.

In the method of manufacturing a ruthenium-containing thin film according to an exemplary embodiment of the present invention, the ruthenium(0)-based hydrocarbon compound used as a precursor may be changed to a gas state by a method such as heating for thin film deposition, and added to a process chamber.

In the method of manufacturing a ruthenium-containing thin film according to an exemplary embodiment of the present invention, the reaction gas is changed to a gas state by a method such as heating and added to a process chamber having a substrate on which the ruthenium(0)-based hydrocarbon compound is adsorbed.

In the method of manufacturing a ruthenium-containing thin film according to an exemplary embodiment of the present invention, the ruthenium(0)-based hydrocarbon compound and the reaction gas may be organically or independently of each other supplied to the chamber. In addition, the ruthenium(0)-based hydrocarbon compound and the reaction gas may be continuously or discontinuously supplied to a chamber, respectively, and a discontinuous supply may include a pulse form.

In the method of manufacturing a ruthenium-containing thin film according to an exemplary embodiment of the present invention, for exhausting unreacted ruthenium(0)-based hydrocarbon compound gas or by-produced gas, or unreacted reaction gas after step b) and/or step c), supplying inert gas into a chamber to perform purging is further performed, of course. The inert gas may be any one or two or more selected from the group consisting of nitrogen ($N_2$), argon, and helium. An injected amount of purge gas is not limited, but specifically an injected amount in a range of 800 to 5,000 sccm may be provided, and more specifically an injected amount in a range of 1,000 to 3,000 sccm may be provided, of course.

That is, the manufacturing method according to an exemplary embodiment of the present invention may include: a) maintaining a temperature of a substrate mounted in a chamber to 80 to 500° C.; b) injecting carrier gas and the ruthenium(0)-hydrocarbon compound; d1) using inert gas to purge the inside of the chamber; c) injecting reaction gas which is iodine, (C1-C3)alkyl iodide, silane iodide, or a mixture thereof to manufacture the ruthenium-containing thin film on the substrate; and d2) using inert gas to purge the inside of the chamber.

The substrate according to an exemplary embodiment of the present invention is any one which may be used within the scope recognized by a person skilled in the art, the temperature of the substrate is also not limited, however, may be preferably 200 to 400° C., and the temperature range is caused by decomposition properties of the ruthenium(0)-based hydrocarbon compound used as the precursor itself, and the reaction properties with other materials such as iodine, (C1-C3)alkyl iodide, silane iodide, or a mixture thereof used as the reaction gas.

The substrate which may be used in an exemplary embodiment of the present invention may be a substrate including one or more semiconductor materials among Si, Ge, SiGe, GaP, GaAs, SiC, SiGeC, InAs and InP; a flexible plastic substrate such as a SOI (silicon on insulator) substrate; a quartz substrate; or a glass substrate for display; a flexible plastic substrate such as polyimide, polyethylene terephthalate (PET), polyethylene naphthalate (PEN), polymethyl methacrylate (PMMA), polycarbonate (PC), polyethersulfone (PES) and polyester; or a tungsten substrate, but not limited thereto.

In the method of manufacturing a ruthenium-containing thin film according to an exemplary embodiment of the present invention, corresponding deposition conditions except using the ruthenium(0)-based hydrocarbon compound as the precursor, and the reaction gas which is iodine, (C1-C3)alkyl iodide, silane iodide, or a mixture thereof may be adjusted depending on the structure or thermal properties of a desired thin film.

As deposition conditions according to an exemplary embodiment of the present invention, an input flow rate of the ruthenium(0)-based hydrocarbon compound as the precursor, an input flow rate of carrier gas, pressure, RF power, a substrate temperature and the like may be included, and as a non-limited example of the deposition conditions, an input flow rate of the ruthenium(0)-based hydrocarbon compound of 1 to 1000 cc/min, an input flow rate of the carrier gas of 1 to 1000 cc/min, a flow rate of the reaction gas of 1 to 1000 cc/min, a pressure of 0.1 to 100 torr, an RF power of 200 to 1000 W, a substrate temperature of 80 to 500° C., preferably 200 to 400° C. may be adjusted within the range, but not limited thereto.

Preferably, the reaction gas according to an exemplary embodiment of the present invention may be used at 0.1 to 200 mol, based on 1 mol of the ruthenium(0)-based hydrocarbon compound, but not limited thereto, and may be adjusted depending on the thin film deposition conditions. As an example, in the case of atomic layer deposition (ALD), plasma-enhanced chemical vapor deposition (PECVD), or Chemical vapor deposition (CVD), the reaction gas may be used at preferably at 1 to 100 mol, more preferably 1 to 50 mol, and still more preferably 2 to 30 mol, based on 1 mol of the ruthenium(0)-based hydrocarbon compound.

The method of manufacturing a ruthenium-containing thin film according to an exemplary embodiment of the present invention may further include a step of heat treatment after step c), and the heat treatment may be performed at 200 to 700° C. for 30 minutes to 4 hours, preferably 300 to 600° C. for 1 hour to 2 hours, under a hydrogen atmosphere.

The ruthenium(0)-based hydrocarbon compound according to an exemplary embodiment of the present invention may be any one as long as the compound is a ruthenium (0)-based hydrocarbon compound which may be used as the precursor for depositing a ruthenium-containing thin film, however, as preferred combination of iodine, (C1-C3)alkyl iodide, silane iodide, or a mixture thereof which is the reaction gas, the ruthenium(0)-based hydrocarbon compound may be represented by the following Chemical Formula 1:

[Chemical Formula 1]

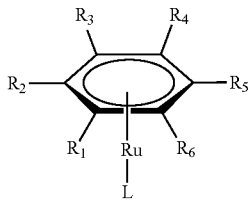

wherein

L is a neutral ligand having 1 to 4 double bonds which is one compound selected from the group consisting of an acyclic alkene compound having 2 to 10 carbon atoms, a cyclic alkene compound having 3 to 10 carbon atoms, an acyclic or cyclic heteroalkene like structure compound having 2 to 8 carbon atoms containing 1 to 4 heteroatoms selected from nitrogen and oxygen, and a carbonyl group-containing compound; and $R_1$ to $R_6$ are independently of one another hydrogen or (C1-C7)alkyl.

Preferably, in Chemical Formula 1 according to an exemplary embodiment of the present invention, L may be a neutral ligand having 1 to 4 double bonds which is one compound selected from the group consisting of an acyclic alkene compound having 2 to 10 carbon atoms, a cyclic alkene compound having 3 to 10 carbon atoms, an acyclic or cyclic heteroalkene-like structure compound having 2 to 8 carbon atoms containing 1 to 4 nitrogens, CO and acetylacetonate, and more preferably L may be an acyclic alkene compound having 2 to 10 carbon atoms, having 1 to 4 double bonds, a cyclic alkene compound having 3 to 10 carbon atoms, having 1 to 4 double bonds, or CO.

More preferably, the ruthenium(0)-based hydrocarbon compound of Chemical Formula 1 according to an exemplary embodiment of the present invention may be represented by the following Chemical Formula 1-1 or 1-2:

[Chemical Formula 1-1]

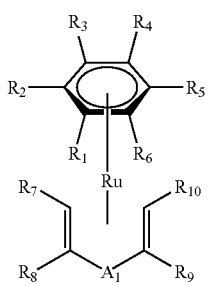

[Chemical Formula 1-2]

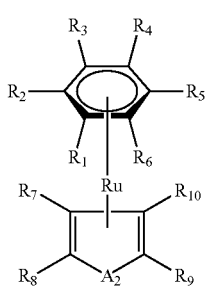

wherein $R_1$ to $R_{10}$ are independently of one another hydrogen or (C1-C7)alkyl;

$A_1$ is a single bond or $—(CR_{11}R_{12})_m—$ in which $R_{11}$ and $R_{12}$ are independently of each other hydrogen or (C1-C7)alkyl, and m is an integer of 1 to 3; and $A_2$ is $—(CR_{11}R_{12})_n—$ in which $R_{11}$ and $R_{12}$ are independently of each other hydrogen or (C1-C7)alkyl, and n is an integer of 1 to 3.

Preferably, in Chemical Formula 1-1 or 1-2 according to an exemplary embodiment of the present invention, $R_1$ to $R_{10}$ may be independently of one another hydrogen or (C1-C5)alkyl; $A_1$ may be a single bond or $—(CR_{11}R_{12})_m—$; $A_2$ may be $—(CR_{11}R_{12})_n—$; $R_{11}$ and $R_{12}$ may be independently of each other hydrogen or (C1-C5)alkyl; m may be an integer of 1 or 2; and n may be an integer of 1 or 2.

In an exemplary embodiment of the present invention, the ruthenium(0)-based hydrocarbon compound by a preferred combination of iodide, (C1-C3)alkyl iodide, silane iodide, or a mixture thereof as the reaction gas may be represented by the following Chemical Formula 2 or 3:

[Chemical Formula 2]

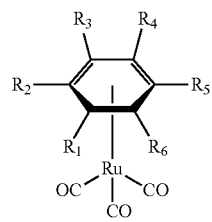

[Chemical Formula 3]

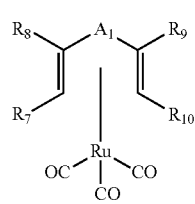

wherein $R_1$ to $R_6$ are independently of one another hydrogen or (C1-C7)alkyl;

$R_7$ to $R_{10}$ are independently of one another hydrogen or (C1-C7)alkyl; and $A_1$ is a single bond or $—(CR_{11}R_{12})_m—$ in which $R_{11}$ and $R_{12}$ are independently of each other hydrogen or (C1-C7)alkyl, and m is an integer of 1 to 3.

Preferably, in Chemical Formula 2 or 3 according to an exemplary embodiment of the present invention, $R_1$ to $R_6$ may be independently of one another hydrogen or (C1-C5)alkyl; $R_7$ to $R_{10}$ may be independently of one another hydrogen or (C1-C5)alkyl; $A_1$ may be a single bond or $—(CR_{11}R_{12})_m—$; $R_{11}$ and $R_{12}$ may be independently of each other hydrogen or (C1-C5)alkyl; and m may be an integer of 1 or 2.

More preferably, the ruthenium(0)-based hydrocarbon compound according to an exemplary embodiment of the present invention may be compounds selected from the following structure, but not limited thereto:

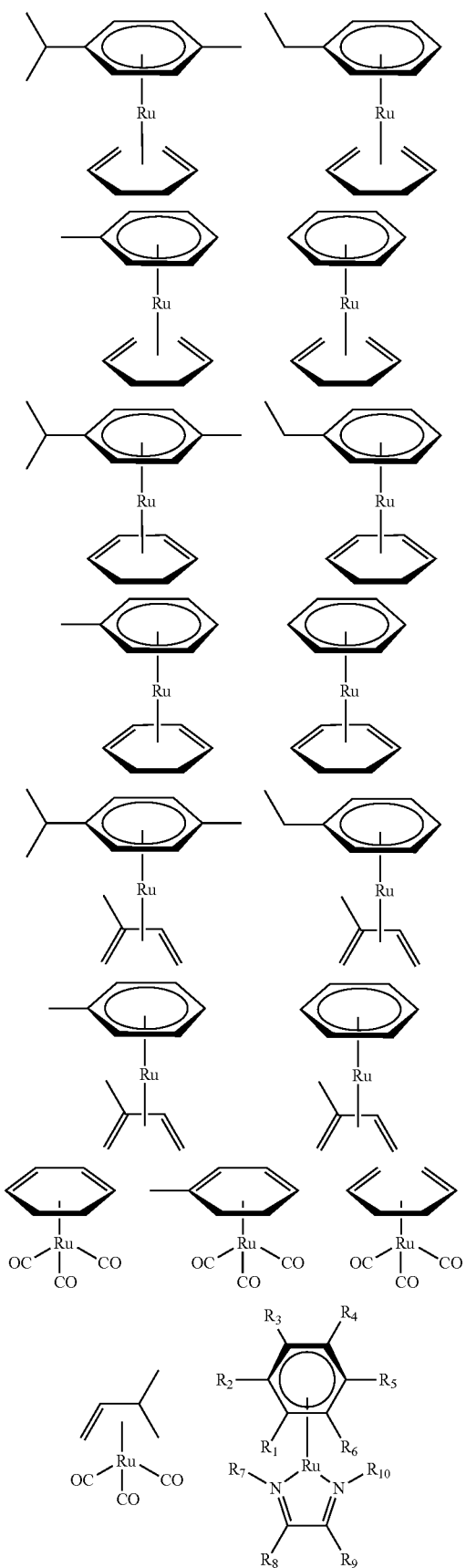

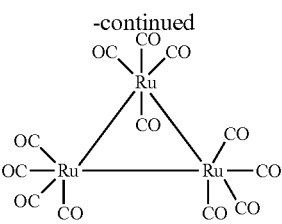

wherein $R_1$ to $R_{10}$ are independently of one another hydrogen or (C1-C7)alkyl.

Preferably, the reaction gas according to an exemplary embodiment of the present invention may be $I_2$, $CH_3I$, $CH_2I_2$, $CHI_3$, $CH_3CH_2I$, $CH_3CHI_2$, $ICH_2CH_2I$, $CH_3CH_2CH_2I$, $CH_3CHICH_3$, $ICH_2CH_2CH_2I$, or $SiH_2I_2$, and more preferably $CH_3CH_2I$, $CH_2I_2$, $ICH_2CH_2CH_2I$, or $SiH_2I_2$.

In the method of manufacturing a ruthenium-containing thin film according to an exemplary embodiment of the present invention, the ruthenium(0)-based hydrocarbon compound may be supplied to the chamber with a carrier gas. Specifically, the carrier gas may be any one or a mixture of two or more selected from the group consisting of nitrogen ($N_2$), hydrogen, argon, and helium, and as a preferred combination with the specific reaction gas of the present invention, may be any one or a mixture of two or more inert gases selected from the group consisting of nitrogen ($N_2$), argon, and helium.

The ruthenium-containing thin film is any thin film which may be manufactured within the scope recognized by a person skilled in the art of supplying a ruthenium precursor in a gaseous phase to manufacture the ruthenium-containing thin film. As a specific and substantial example, the ruthenium-containing thin film may be usually a ruthenium film, a ruthenium oxide film, or a hybrid film thereof having conductivity, and besides, high-quality various thin films containing ruthenium may be manufactured within the scope recognized by a person skilled in the art.

In addition, a composition for depositing a ruthenium-containing thin film includes a ruthenium(0)-based hydrocarbon precursor compound and reaction gas which is iodine, (C1-C30)alkyl iodide, silane iodide, or a mixture thereof, is provided.

Preferably, the reaction gas according to an exemplary embodiment of the composition for depositing a ruthenium-containing thin film of the present invention may be used at 0.1 to 200 mol, preferably 1 to 100 mol, more preferably 1 to 50 mol, and more preferably 2 to 30 mol, based on 1 mol of the ruthenium(0)-based hydrocarbon compound, and the ruthenium(0)-based hydrocarbon compound may be any one or a mixture of two or more selected from the group consisting of ruthenium(0)-based hydrocarbon compounds represented by Chemical Formulae 1, 2 and 3.

Preferably, the reaction gas according to an exemplary embodiment of the composition for depositing a ruthenium-containing thin film of the present invention may be $I_2$, $CH_3I$, $CH_2I_2$, $CHI_3$, $CH_3CH_2I$, $CH_3CHI_2$, $ICH_2CH_2I$, $CH_3CH_2CH_2I$, $CH_3CHICH_3$, $ICH_2CH_2CH_2$, or $SiH_2I_2$.

In addition, the present invention provides a ruthenium-containing thin film is manufactured using the composition for depositing a ruthenium-containing thin film according to an exemplary embodiment of the present invention, and the manufactured ruthenium-containing thin film may have a specific resistance of 100 μω·cm or less, preferably 50

μΩ·cm or less, and ore preferably 30 μΩ·cm or less, and an oxygen content of 3 at % or less, and preferably 1 at % or less.

Preferably, the ruthenium-containing thin film according to an exemplary embodiment of the present invention may have a carbon content of 3 at % or less, and preferably 1 at % or less.

The ruthenium-containing thin film of the present invention having high purity, high density and high durability may be manufactured by a simple process, by using the ruthenium(0)-based hydrocarbon compound and specific reaction gas, that is, iodine, (C1-C3)alkyl iodide, silane iodide, or a mixture thereof. In addition, when manufacturing the ruthenium-containing thin film, iodine, (C1-C3)alkyl iodide, silane iodide, or a mixture thereof, not oxygen as the reaction gas is used, whereby a lower film may not be oxidized during a deposition process and a lower film of the ruthenium-containing thin film may not be oxidized even after formation. Thus, increase in contact resistance between the ruthenium-containing thin film and the lower film due to an oxide formed at the interface with the lower film, may be prevented.

In addition, when manufacturing the ruthenium-containing thin film, the ruthenium(0)-based hydrocarbon compound and certain reaction gas, that is, iodine, (C1-C3)alkyl iodide, silane iodide, or a mixture thereof are used to improve crystal quality, whereby specific resistance of the thin film may be decreased to 100 μΩ·cm or less, preferably 50 μΩ·cm or less, and more preferably 30 μΩ·cm or less, and an oxygen content in the thin film may be decreased to 3 at % or less, and preferably 1 at % or less.

Hereinafter, the present invention will be described in detail by the following Examples. Prior to that, terms and words used in the present specification and claims are not to be construed as a general or dictionary meaning but are to be construed as meaning and concepts meeting the technical ideas of the present invention based on a principle that the inventors can appropriately define the concepts of terms in order to describe their own inventions in best mode.

Therefore, the configurations illustrated in the Examples and drawings described herein are merely the most preferred exemplary embodiment of the present invention but do not represent all of the technical spirit of the present invention. Thus, it should be understood that there are various equivalents and modified examples to replace these at the time of filing the present application.

In addition, the following examples were all carried out by the known atomic layer deposition (ALD) using 200 mm single wafer type ALD equipment (CN1, Atomic Premium) in a shower head mode which is commercialized. In addition, it may be carried out by the known plasma-enhanced chemical vapor deposition (PECVD) using 200 mm single wafer type CVD equipment (CN1, Atomic Premium) in a commercialized shower head mode.

For the deposited ruthenium-containing thin film, the specific resistivity was measured using a sheet resistance meter (4 point probe, DASOLENG, ARMS-200C), the thickness was measured by a transmission electron microscope (FEI (Netherlands) Tecnai $G^2$F30S-Twin), and the composition of the thin film was analyzed using a method (Time of Flight-Elastic Recoil Detection (TOF-ERD), NEC).

Example 1

Manufacture of Ruthenium-Containing Thin Film

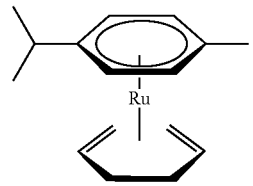

(Compound 1) was used as a Ru-containing precursor compound, and ethane iodide ($CH_3CH_2I$) was used as reaction gas to form a ruthenium-containing thin film by atomic layer deposition.

First, a silicon oxide film substrate was maintained at 250° C., and Compound 1 was filled into a stainless steel bubbler vessel, which was maintained at 110° C. Compound 1 which was vaporized in the stainless steel bubbler vessel was transferred to a silicon dioxide substrate for 3 seconds (0.0015 g) using argon gas (50 sccm) as carrier gas, and allowed to be adsorbed on the silicon oxide film substrate. Next, Compound 1 which was unreacted was removed therefrom for 1 second using argon gas (3000 sccm). Thereafter, ethane iodide ($CH_3CH_2I$) heated to 30° C. was supplied for 0.1 seconds (0.002 g) to form a ruthenium-containing thin film. Finally, reaction by-products and remaining reaction gas were removed for 1 second using argon gas (3000 sccm). The reaction gas (ethane iodide) was used at 2.7 mol, based on 1 mol of the ruthenium(0)-based hydrocarbon compound (Compound 1). The above-described process was 1 cycle, and 1500 cycles were repeated to form the ruthenium-containing thin film. The formed ruthenium thin film was heat-treated at 450° C. for 2 hours under a hydrogen atmosphere in a furnace, and the results of a gap-fill by TEM analysis are shown in FIG. 1.

Detailed thin film manufacturing conditions are shown in the following Table 1.

TABLE 1

| | Thin film manufacturing condition | Example 1 |
|---|---|---|
| | Substrate temperature (° C.) | 250 |
| Ru precursor | Precursor heating temperature (° C.) | 110 |
| | Precursor injection time (second) | 3 |
| Purge (argon) | Flow rate (sccm) | 3000 |
| | Time (second) | 1 |
| Ethane iodide | Reaction gas heating temperature (° C.) | 30 |
| (reaction gas) | Reaction gas injection time (second) | 0.1 |
| Purge (argon) | Flow rate (sccm) | 3000 |
| | Time (second) | 1 |
| Number of depositions | Cycle | 1500 |

As shown in FIG. 1, the ruthenium-containing thin film deposited in Example 1 easily formed a gap-fill after heat treatment under a hydrogen atmosphere.

Example 2

Manufacture of Ruthenium-Containing Thin Film

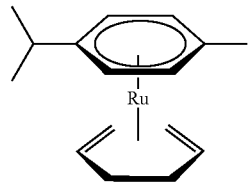

(Compound 1) was used as a Ru-containing precursor compound, and methane diiodide (CH$_2$I$_2$) was used as reaction gas to form a ruthenium-containing thin film by atomic layer deposition.

Figure 2:
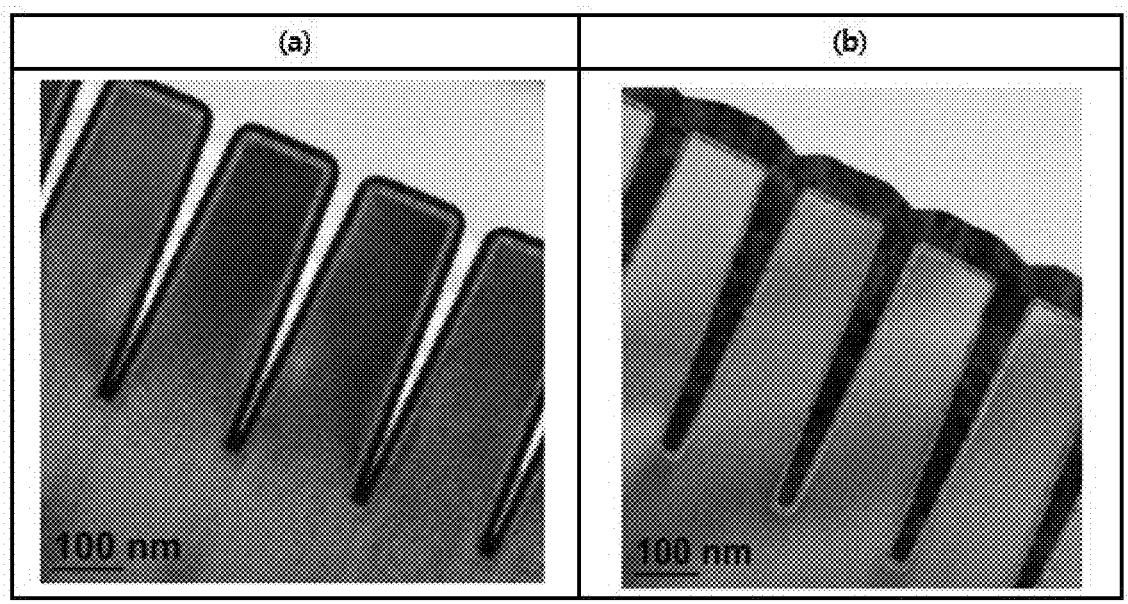
FIG. 2 is a drawing illustrating (a) the result of a gap-fill and (b) the result of a step coverage by TEM analysis of the ruthenium thin film of Example 2.

A silicon oxide film substrate was maintained at 280° C., and Compound 1 was filled into a stainless steel bubbler vessel, which was maintained at 110° C. Compound 1 which was vaporized in the stainless steel bubbler vessel was transferred to a silicon dioxide substrate for 2 seconds (0.001 g) using argon gas (50 sccm) as carrier gas, and allowed to be adsorbed on the silicon oxide film substrate. Next, Compound 1 which was unreacted was removed therefrom for 0.5 seconds using argon gas (3000 sccm). Thereafter, methane diiodide (CH$_2$I$_2$) heated to 90° C. was supplied for 0.4 seconds (0.005 g) to form a ruthenium-containing thin film. Finally, reaction by-products and remaining reaction gas were removed for 0.1 second using argon gas (3000 sccm). The reaction gas (methane diiodide) was used at 5.9 mol, based on 1 mol of the ruthenium(0)-based hydrocarbon compound (Compound 1). The above-described process was 1 cycle, and 800 cycles were repeated to form the ruthenium-containing thin film. The results of gap-fill and the result of a step coverage by TEM analysis of the formed ruthenium thin film are shown in FIG. 2.

Detailed reaction conditions are shown in the following Table 2.

TABLE 2

| Thin film manufacturing condition | | Example 2 |
|---|---|---|
| | Substrate temperature (° C.) | 280 |
| Ru precursor | Precursor heating temperature (° C.) | 110 |
| | Precursor injection time (second) | 2 |
| Purge (argon) | Flow rate (sccm) | 3000 |
| | Time (second) | 0.5 |
| Methane diiodide (Reaction gas) | Reaction gas heating temperature (° C.) | 90 |
| | Reaction gas injection time (second) | 0.4 |
| Purge (argon) | Flow rate (sccm) | 3000 |
| | Time (second) | 0.1 |
| Number of depositions | Cycle | 800 |

As shown in FIG. 2, it was found that the ruthenium-containing thin film manufactured in Example 2 easily formed a gap-fill ((a) of FIG. 2), and had an excellent step coverage ((b) of FIG. 2).

Example 3

Manufacture of Ruthenium-Containing Thin Film

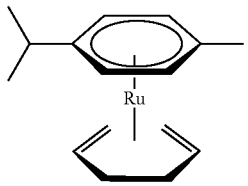

(Compound 1) was used as a Ru-containing precursor compound, and methane diiodide (CH$_2$I$_2$) was used as reaction gas to form a ruthenium-containing thin film by chemical vapor deposition (CVD).

A silicon oxide film substrate was maintained at 280° C., and Compound 1 was filled into a stainless steel bubbler vessel, which was maintained at 110° C. Compound 1 which was vaporized in the stainless steel bubbler vessel was injected to a reaction chamber for 70 minutes (2.1 g) using argon gas (50 sccm) as a carrier gas, and at the same time, methane diiodide (CH$_2$I$_2$) heated to 90° C. was injected to a reaction chamber for 70 minutes (52.5 g) using argon gas (25 sccm) as a carrier gas, thereby forming a ruthenium-containing thin film. For maintaining chamber pressure to 30 torr or more, argon gas (5000 sccm) was injected and the process was carried out for 70 minutes, thereby forming a ruthenium-containing thin film. The reaction gas (methane diiodide) was used at 25.0 mol, based on 1 mol of the ruthenium(0)-based hydrocarbon compound (Compound 1). Detailed reaction conditions are shown in the following Table 3.

TABLE 3

| Thin film manufacturing condition | Example 3 |
|---|---|
| Substrate temperature (° C.) | 280 |
| Ru precursor temperature (° C.) | 110 |
| Ru precursor bubble gas (sccm) | 50 |
| Methane diiodide temperature (° C.) | 90 |
| Methane diiodide bubble gas (sccm) | 25 |
| Process pressure (Torr) | 30 |
| Process time (min) | 70 |

Figure 3:
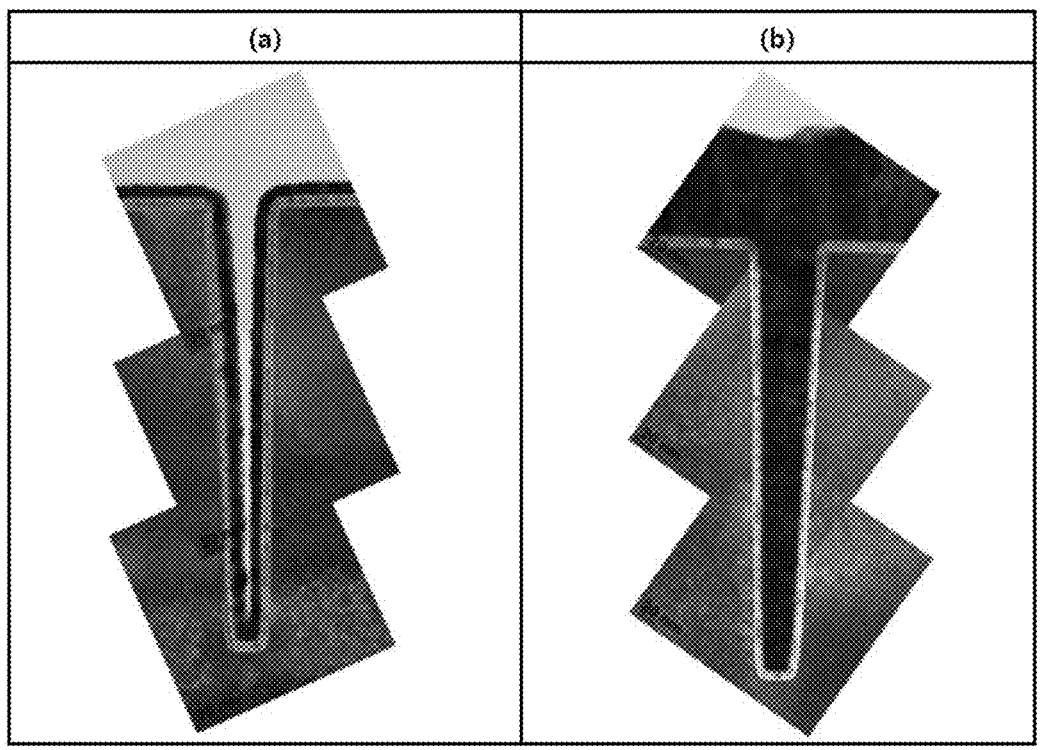
FIG. 3 is a drawing illustrating (a) the result of a gap-fill and (b) the result of a step coverage by TEM analysis of the ruthenium thin film of Example 3.

The results of TEM analysis of the ruthenium-containing thin film deposited in Example 3 are shown in FIG. 3, and as shown in FIG. 3, it was found that a gap-fill may be easily formed ((a) of FIG. 3), and a step coverage was excellent ((b) of FIG. 3).

Comparative Example 1

Manufacture of Ruthenium-Containing Thin Film

A ruthenium-containing thin film was manufactured in the same manner as in Example 1, except that oxygen was used instead of ethane iodide as reaction gas, and detailed conditions of the ruthenium-containing thin film deposition are shown in the following Table 4.

TABLE 4

| Thin film manufacturing condition | | Comparative Example 1 |
|---|---|---|
| | Substrate temperature (° C.) | 250 |
| Ru precursor | Precursor heating temperature (° C.) | 110 |
| | Precursor injection time (second) | 3 |
| Purge (argon) | Flow rate (sccm) | 3000 |
| | Time (second) | 1 |
| Reaction gas | Oxygen (sccm) | 500 |
| | Time (second) | 2 |
| Purge (argon) | Flow rate (sccm) | 3000 |
| | Time (second) | 1 |
| Number of depositions | Cycle | 1500 |

Comparative Example 2

Manufacture of Ruthenium-Containing Thin Film

A ruthenium-containing thin film was manufactured in the same manner as in Example 1, except that hydrogen was used instead of ethane iodide as reaction gas, and detailed conditions of the ruthenium-containing thin film deposition are shown in the following Table 5.

TABLE 5

| Thin film manufacturing condition | | Comparative Example 2 |
|---|---|---|
| | Substrate temperature (° C.) | 250 |
| Ru precursor | Precursor heating temperature (° C.) | 110 |
| | Precursor injection time (second) | 3 |
| Purge (argon) | Flow rate (sccm) | 3000 |
| | Time (second) | 1 |
| Reaction gas | Hydrogen (sccm) | 2000 |
| | Time (second) | 5 |
| Purge (argon) | Flow rate (sccm) | 3000 |
| | Time (second) | 1 |
| Number of depositions | Cycle | 1500 |

Figure 4:
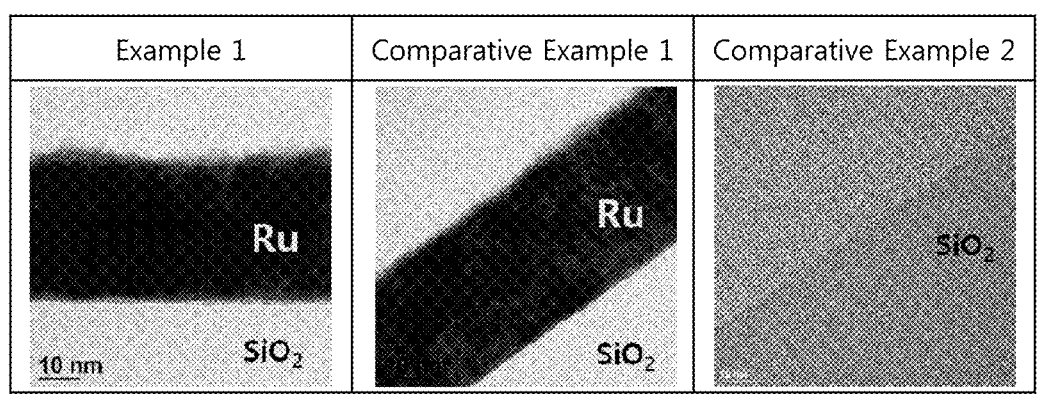
FIG. 4 is a drawing illustrating the result of TEM analysis of the thin films manufactured in Example 1 and Comparative Examples 1 and 2.

The results of TEM analysis of the ruthenium-containing thin film deposited in Comparative Examples 1 and 2 are shown in FIG. 4. As shown in FIG. 4, in Comparative Example 1 using oxygen as the reaction gas, the ruthenium-containing thin film was formed, however, in Comparative Example 2 using hydrogen as the reaction gas, the ruthenium-containing thin film was not formed.

Example 4

Manufacture of Ruthenium-Containing Thin Film

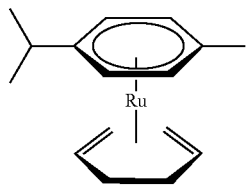

(Compound 1) was used as a Ru-containing precursor compound, and silane diiodide (SiH$_2$I$_2$) was used as reaction gas to form a ruthenium-containing thin film by atomic layer deposition.

A silicon oxide film substrate was maintained at 280° C., and Compound 1 was filled into a stainless steel bubbler vessel, which was maintained at 110° C. Compound 1 which was vaporized in the stainless steel bubbler vessel was transferred to a silicon oxide film substrate for 2 seconds (0.001 g) using argon gas (50 sccm) as carrier gas, and allowed to be adsorbed on the silicon oxide film substrate. Next, Compound 1 which was unreacted was removed therefrom for 0.5 seconds using argon gas (3000 sccm). Thereafter, silane diiodide (SiH$_2$I$_2$) heated to 34° C. was supplied for 1 second (0.003 g) to form a ruthenium-containing thin film. Finally, reaction by-products and remaining reaction gas were removed for about 0.1 seconds using argon gas (3000 sccm). The reaction gas (silane diiodide) was used at 3.4 mol, based on 1 mol of the ruthenium(0)-based hydrocarbon compound (Compound 1). The above-described process was 1 cycle, and 800 cycles were repeated to form the ruthenium-containing thin film. Detailed reaction conditions are shown in the following Table 6.

TABLE 6

| Thin film manufacturing condition | | Example 4 |
|---|---|---|
| | Substrate temperature (° C.) | 280 |
| Ru precursor | Precursor heating temperature (° C.) | 110 |
| | Precursor injection time (second) | 2 |
| Purge (argon) | Flow rate (sccm) | 3000 |
| | Time (second) | 0.5 |
| Silane diiodide (Reaction gas) | Reaction gas heating temperature (° C.) | 34 |
| | Reaction gas injection time (second) | 1 |
| Purge (argon) | Flow rate (sccm) | 3000 |
| | Time (second) | 0.1 |
| Number of depositions | Cycle | 800 |

Example 5

Manufacture of Ruthenium-Containing Thin Film

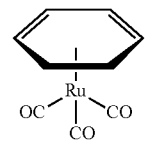

(Compound 2) was used as a Ru-containing precursor compound, and methane diiodide (CH$_2$I$_2$) was used as reaction gas to form a ruthenium-containing thin film by atomic layer deposition.

A silicon oxide film substrate was maintained at 300° C., and Compound 2 was filled into a stainless steel bubbler vessel, which was maintained at 36° C. Compound 2 which was vaporized in the stainless steel bubbler vessel was transferred to a silicon oxide film substrate for 2 seconds (0.002 g) using argon gas (10 sccm) as carrier gas, and allowed to be adsorbed on the silicon oxide film substrate. Next, Compound 2 which was unreacted was removed therefrom for 5 seconds using argon gas (3000 sccm). Thereafter, methane diiodide (CH$_2$I$_2$) heated to 90° C. was supplied for 0.4 seconds (0.005 g) to form a ruthenium-containing thin film. Finally, reaction by-products and remaining reaction gas were removed for 5 second using argon gas (3000 sccm). The reaction gas (methane diiodide)

was used at 2.5 mol, based on 1 mol of the ruthenium(0)-based hydrocarbon compound (Compound 2). The above-described process was 1 cycle, and 800 cycles were repeated to form the ruthenium-containing thin film.

Detailed reaction conditions are shown in the following Table 7.

TABLE 7

| Thin film manufacturing condition | | Example 5 |
|---|---|---|
| | Substrate temperature (° C.) | 300 |
| Ru precursor | Precursor heating temperature (° C.) | 36 |
| | Precursor injection time (second) | 2 |
| Purge (argon) | Flow rate (sccm) | 3000 |
| | Time (second) | 5 |
| Methane diiodide (Reaction gas) | Reaction gas heating temperature (° C.) | 90 |
| | Reaction gas injection time (second) | 0.4 |
| Purge (argon) | Flow rate (sccm) | 3000 |
| | Time (second) | 5 |
| Number of depositions | Cycle | 800 |

Example 6

Manufacture of Ruthenium-Containing Thin Film

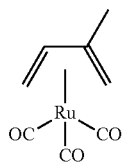

((isoprene)Ru(CO)$_3$, Compound 3) was used as a Ru-containing precursor compound, and methane diiodide (CH$_2$I$_2$) was used as reaction gas to form a ruthenium-containing thin film by atomic layer deposition.

A silicon oxide film substrate was maintained at 250° C., and Compound 3 was filled into a stainless steel bubbler vessel, which was maintained at 24° C. Compound 3 which was vaporized in the stainless steel bubbler vessel was transferred to a silicon oxide film substrate for 2 seconds (0.0016 g) using argon gas (50 sccm) as carrier gas, and allowed to be adsorbed on the silicon oxide film substrate. Next, Compound 3 which was unreacted was removed therefrom for 5 seconds using argon gas (3000 sccm). Thereafter, methane diiodide (CH$_2$I$_2$) heated to 90° C. was supplied for 0.4 seconds (0.005 g) to form a ruthenium-containing thin film. Finally, reaction by-products and remaining reaction gas were removed for 5 second using argon gas (3000 sccm). The reaction gas (methane diiodide) was used at 3.0 mol, based on 1 mol of the ruthenium(0)-based hydrocarbon compound (Compound 3). The above-described process was 1 cycle, and 400 cycles were repeated to form the ruthenium-containing thin film. Detailed reaction conditions are shown in the following Table 8.

TABLE 8

| Thin film manufacturing condition | | Example 6 |
|---|---|---|
| | Substrate temperature (° C.) | 250 |
| Ru precursor | Precursor heating temperature (° C.) | 24 |
| | Precursor injection time (second) | 2 |

TABLE 8-continued

| Thin film manufacturing condition | | Example 6 |
|---|---|---|
| Purge (argon) | Flow rate (sccm) | 3000 |
| | Time (second) | 5 |
| Methane diiodide (Reaction gas) | Reaction gas heating temperature (° C.) | 90 |
| | Reaction gas injection time (second) | 0.4 |
| Purge (argon) | Flow rate (sccm) | 3000 |
| | Time (second) | 5 |
| Number of depositions | Cycle | 400 |

The specific resistance of the ruthenium-containing thin film manufactured in Examples 1 to 6 and Comparative Examples 1 and 2, and the composition of the manufactured ruthenium-containing thin film were analyzed by TOF-ERD (Time of Flight-Elastic Recoil Detection), and the results are shown in Table 9.

TABLE 9

| | Specific resistance [μΩ·cm] | TOF-ERD analysis | | | |
|---|---|---|---|---|---|
| | | C [at %] | O [at %] | Ru [at %] | H [at %] |
| Example 1 | 25 | 0.3 | 0.2 | 93.3 | 6.2 |
| Example 2 | 18 | 0.7 | 0.3 | 94.3 | 4.7 |
| Example 3 | 24 | 1.3 | 0.5 | 92.4 | 5.8 |
| Example 4 | 22 | 1.9 | 0.5 | 91.0 | 6.6 |
| Example 5 | 28 | 2.1 | 0.4 | 90.4 | 7.1 |
| Example 6 | 25 | 1.4 | 0.6 | 92.9 | 5.1 |
| Comparative Example 1 | 27 | 0.5 | 4.6 | 90.2 | 4.7 |
| Comparative Example 2 | ∞ | — | — | — | — |

At % refers to atomic percent.

As shown in Table 9, the ruthenium-containing thin films of Examples 1 to 6 using alkyl iodide or silane iodide as the reaction gas had specific resistance of 18 to 28 μΩ·cm, which was significantly lower than the specific resistance of Comparative Example 2 using hydrogen as the reaction gas.

In addition, as a result of TOF-ERD analysis, the ruthenium-containing thin films of Examples 1 to 6 using alkyl iodide or silane iodide as the reaction gas had an oxygen content of 0.6 at % or less in the thin film, which was significantly lower than the oxygen content in the thin film of Comparative Example 1 using oxygen as the reaction gas.

In addition, as shown in FIG. 1, it was found that a gap-fill was easily formed after heat treatment under a hydrogen atmosphere according to Example 1 of the present invention.

Also, as shown in FIGS. 2 and 3, it was found that the thin film manufactured in Examples 2 and 3 of the present invention easily formed a gap-fill, and had an excellent step coverage.

Example 7

Analysis of Growth Rate Depending on Injection Rate of Ruthenium Precursor Used in Manufacture of Ruthenium-Containing Thin Film A ruthenium-containing thin film was manufactured in the same manner as in Example 1, except that the injection time of Compound 1 was changed to from 0.5 to 5 seconds.

Figure 5:
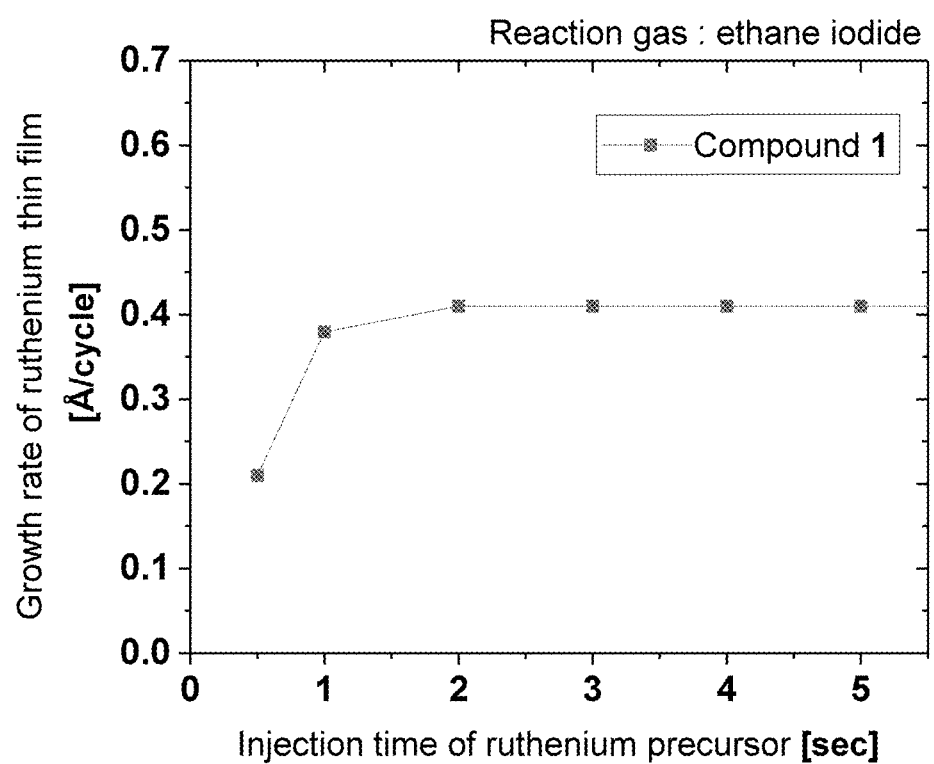
FIG. 5 is a drawing illustrating a growth rate of a ruthenium thin film depending on an injection time of a ruthenium precursor in Example 7.

The results of saturation for the ruthenium precursor of the ruthenium-containing thin film manufactured in Example 7, analyzed by a transmission electron microscope are shown in FIG. 5. As shown in FIG. 5, it was confirmed that the ruthenium-containing thin film was saturated from 2 seconds of the injection time of Compound 1 and had a constant growth rate.

Example 8

Analysis of Growth Rate Depending on Injection Rate of Ruthenium Precursor Used in Manufacture of Ruthenium-Containing Thin Film A ruthenium-containing thin film was manufactured in the same manner as in Example 2, except that the injection time of Compound 1 was changed to from 0.5 to 5 seconds.

Example 9

Analysis of Growth Rate Depending on Injection Rate of Ruthenium Precursor Used in Manufacture of Ruthenium-Containing Thin Film A ruthenium-containing thin film was manufactured in the same manner as in Example 5, except that the injection time of Compound 2 was changed to from 0.5 to 5 seconds.

Example 10

Ruthenium Precursor Saturation of Manufacture of Ruthenium-Containing Thin Film

Ruthenium-containing thin films were manufactured in the same manner as in Example 6 except that the injection time of Compound 3 was changed to from 0.5 to 5 seconds.

Figure 6:
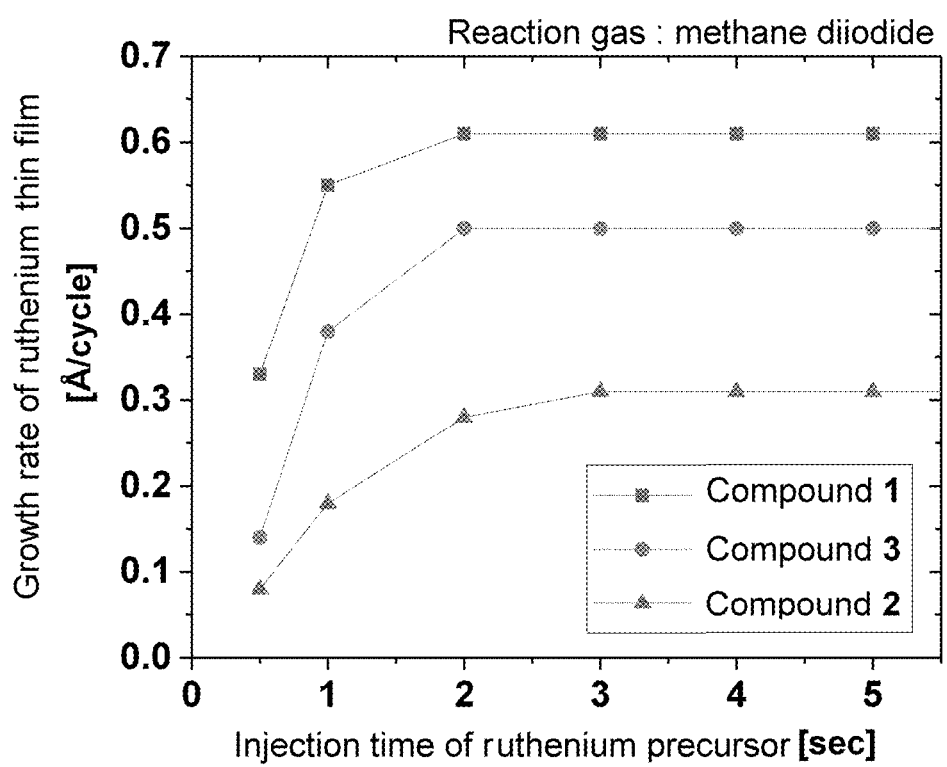
FIG. 6 is a drawing illustrating a growth rate of a ruthenium thin film depending on an injection time of a ruthenium precursor in Examples 8 to 10.

The results of saturation for the ruthenium precursor of the ruthenium-containing thin films manufactured in Examples 8 to 10, analyzed by a transmission electron microscope are shown in FIG. 6. As shown in FIG. 6, it was confirmed that the ruthenium-containing thin film was saturated from 2 seconds of the injection time of Compound 1, from 3 seconds of the injection time of Compound 2, and from 2 seconds of the injection time of Compound 3, and had a constant growth rate.

Example 11

Analysis of Growth Rate Depending on Injection Amount of Reaction Gas Used in Manufacture of Ruthenium-Containing Thin Film A ruthenium-containing thin film was manufactured in the same manner as in Example 1, except that the injection time of ethane iodide was changed to from 0.1 to 5 seconds.

Example 12

Analysis of Growth Rate Depending on Injection Amount of Reaction Gas Used in Manufacture of Ruthenium-Containing Thin Film A ruthenium-containing thin film was manufactured in the same manner as in Example 2, except that the injection time of methane diiodide was changed to from 0.1 to 5 seconds.

Example 13

Analysis of Growth Rate Depending on Injection Amount of Reaction Gas Used in Manufacture of Ruthenium-Containing Thin Film A ruthenium-containing thin film was manufactured in the same manner as in Example 4, except that the injection time of silane diiodide was changed to from 0.1 to 5 seconds.

Comparative Example 3

Analysis of Growth Rate Depending on Injection Amount of Reaction Gas Used in Manufacture of Ruthenium-Containing Thin Film A ruthenium-containing thin film was manufactured in the same manner as in Comparative Example 1, except that the injection time of oxygen gas was changed to from 0.1 to 5 seconds.

Figure 7:
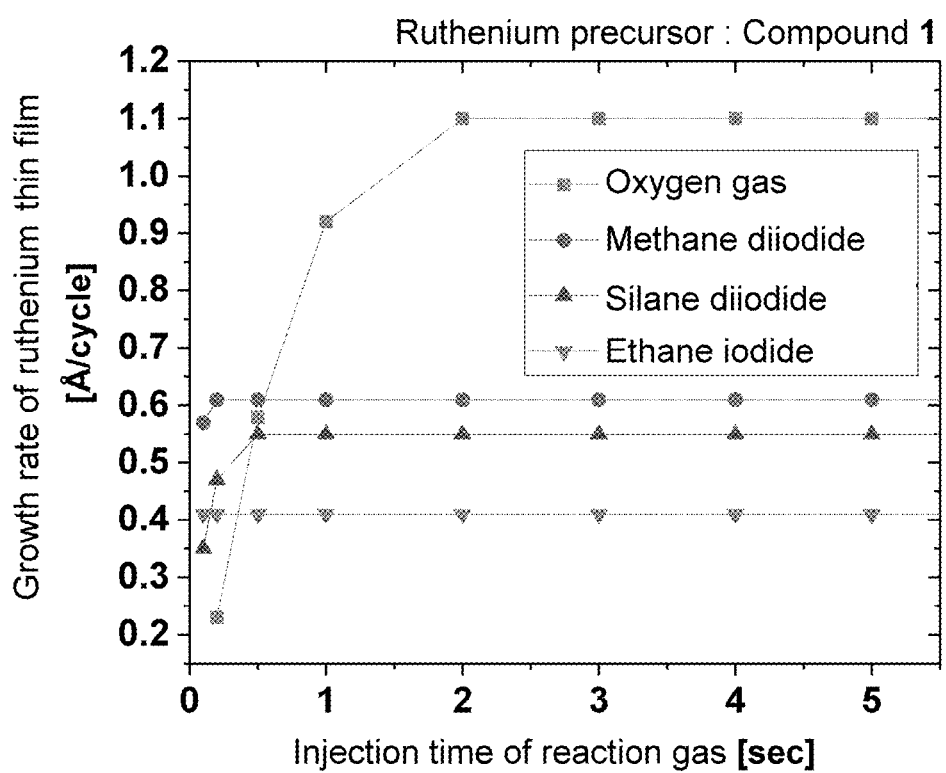
FIG. 7 is a drawing illustrating a growth rate of a ruthenium thin film depending on an injection time of reaction gas in Examples 11 to 13 and Comparative Example 3.

The results of saturation for the reaction gas of the ruthenium-containing thin films manufactured in Examples 11 to 13 and Comparative Example 3, analyzed by a transmission electron microscope are shown in FIG. 7. As shown in FIG. 7, it was confirmed that the ruthenium-containing thin film was saturated from 0.1 seconds of the injection time of ethane iodide, from 0.2 seconds of the injection time of methane diiodide, and from 0.5 seconds of the injection time of silane diiodide, and had a constant growth rate. However, when oxygen was injected as the reaction gas, the ruthenium-containing thin film was saturated from 2 seconds of the injection time of oxygen gas, and had a constant growth rate.

That is, when the ruthenium-containing thin film is deposited, the thin film is more rapidly saturated in the case of using alkyl iodide or silane iodide as the reaction gas than in the case of using oxygen as the reaction gas, so that the growth rate of the ruthenium-containing thin film became constant.

Example 14

Analysis of Growth Rate Depending on Substrate Temperature Used in Manufacture of Ruthenium-Containing Thin Film A ruthenium-containing thin film was manufactured in the same manner as in Example 1, except that the substrate temperature was changed to from 200° C. to 360° C.

Example 15

Analysis of Growth Rate Depending on Substrate Temperature Used in Manufacture of Ruthenium-Containing Thin Film A ruthenium thin film was manufactured in the same manner as in Example 2, except that the substrate temperature was changed to from 200° C. to 360° C.

Example 16

Analysis of Growth Rate Depending on Substrate Temperature Used in Manufacture of Ruthenium-Containing Thin Film A ruthenium-containing thin film was manufactured in the same manner as in Example 4, except that the substrate temperature was changed to from 200° C. to 360° C.

Comparative Example 4

Analysis of Growth Rate Depending on Substrate Temperature Used in Manufacture of Ruthenium-Containing Thin Film A ruthenium-containing thin film was manufactured in the same manner as in Comparative Example 1, except that the substrate temperature was changed to from 200° C. to 360° C.

Example 17

Analysis of Growth Rate Depending on Substrate Temperature Used in Manufacture of Ruthenium-Containing Thin Film A ruthenium-containing thin film was manufactured in the same manner as in Example 5, except that the substrate temperature was changed to from 200° C. to 360° C.

Example 18

Analysis of Growth Rate Depending on Substrate Temperature Used in Manufacture of Ruthenium-Containing Thin Film A ruthenium-containing thin film was manufactured in the same manner as in Example 6, except that the substrate temperature was changed to from 200° C. to 360° C.

Figure 8:
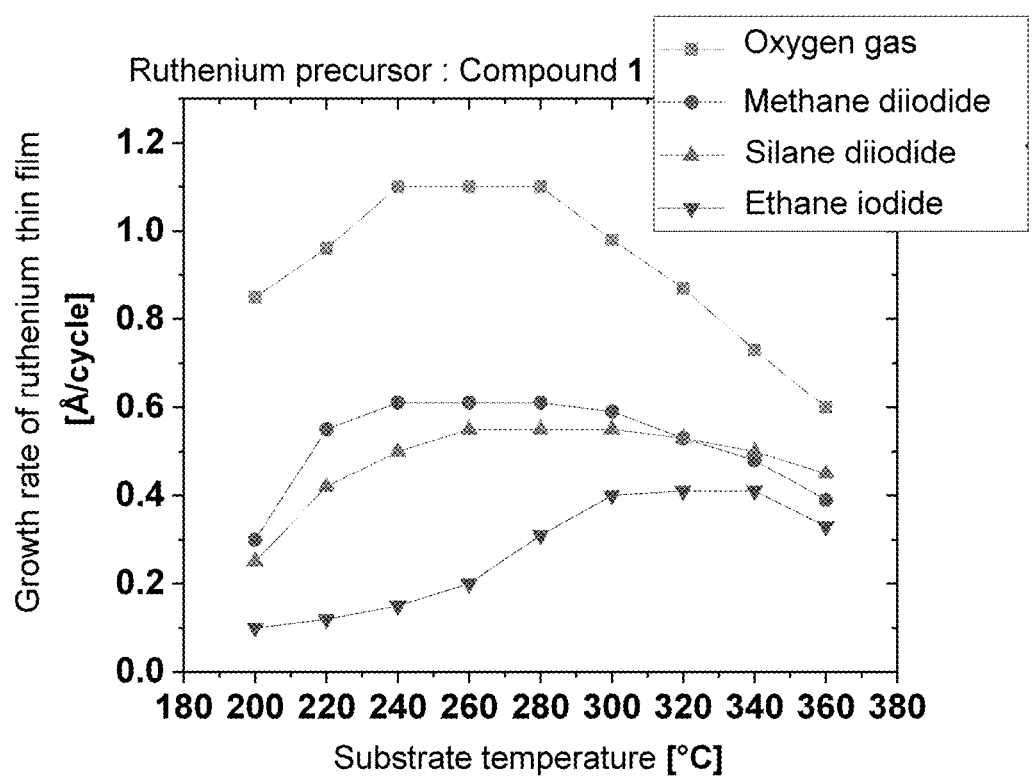
FIG. 8 is a drawing illustrating a growth rate of a ruthenium thin film depending on a substrate temperature in Examples 14 to 16 and Comparative Example 4.
Figure 9:
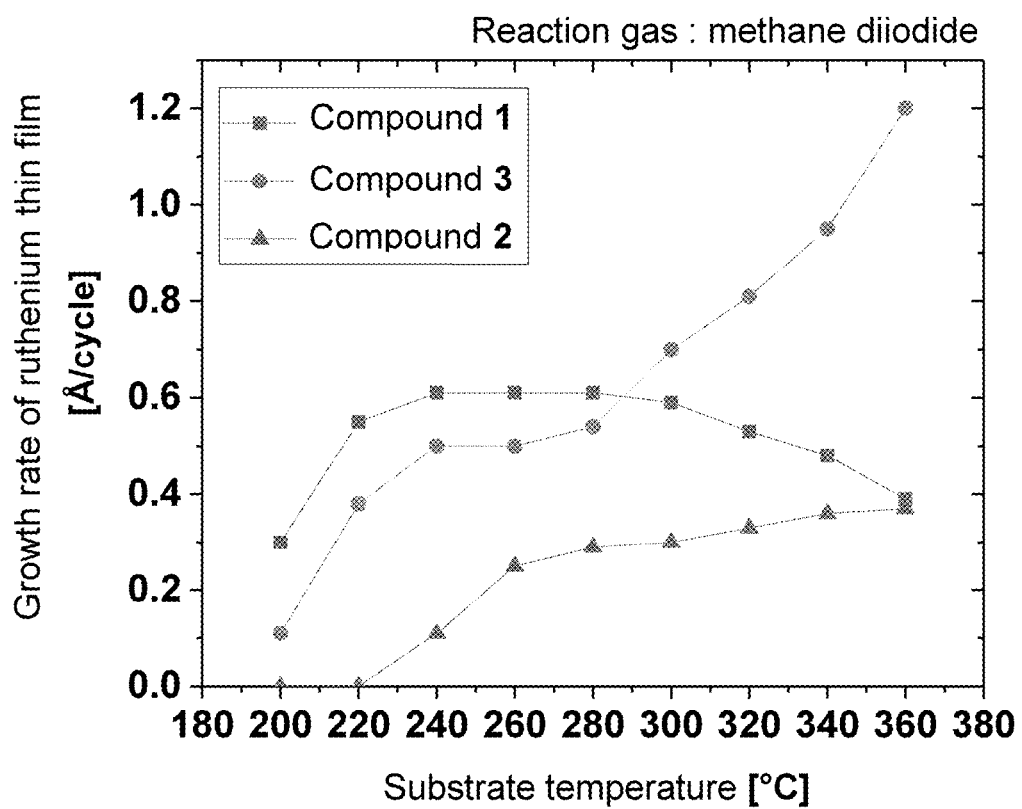
FIG. 9 is a drawing illustrating a growth rate of a ruthenium thin film depending on a substrate temperature in Example 15, Example 17, and Example 18.

The results of a growth rate saturation section depending on the substrate temperature of the ruthenium-containing thin films manufactured in Examples 14 to 18 and Comparative Example 4, analyzed by a transmission electron microscope are shown in FIGS. 8 and 9. The growth rate of the ruthenium-containing thin film was constant over a broad range of the substrate temperature, that is, at a substrate temperature of 300° C. to 340° C. in Example 14, at a substrate temperature of 240° C. to 300° C. in Example 15, at a substrate temperature of 260° C. to 320° C. in Example 16, however, the growth rate of the ruthenium-containing thin film was constant in a narrow range of substrate temperature of 240° C. to 280° C. in Comparative Example 4 [FIG. 8].

That is, when alkyl iodide or silane iodide such as ethane iodide, methane diiodide and silane diiodide was used as the reaction gas to deposit a ruthenium-containing thin film, as in the present invention, it was found that the ruthenium-containing thin film had a constant growth rate over a broad range of the substrate temperature.

In addition, even in the case that the kind of ruthenium precursor compound was changed as in Examples 15, 17 and 18, when alkyl iodide such as methane diiodide was used as the reaction gas to deposit the ruthenium-containing thin film, it was found that the ruthenium-containing thin film also had a constant growth rate over a broad range of the substrate temperature.

Example 19

Growth Depending on the Number of Deposition in Manufacture of Ruthenium-Containing Thin Film A ruthenium-containing thin film was manufactured in the same manner as in Example 2, except that the number of deposition was changed to from 10 to 300 cycles.

Figure 10:
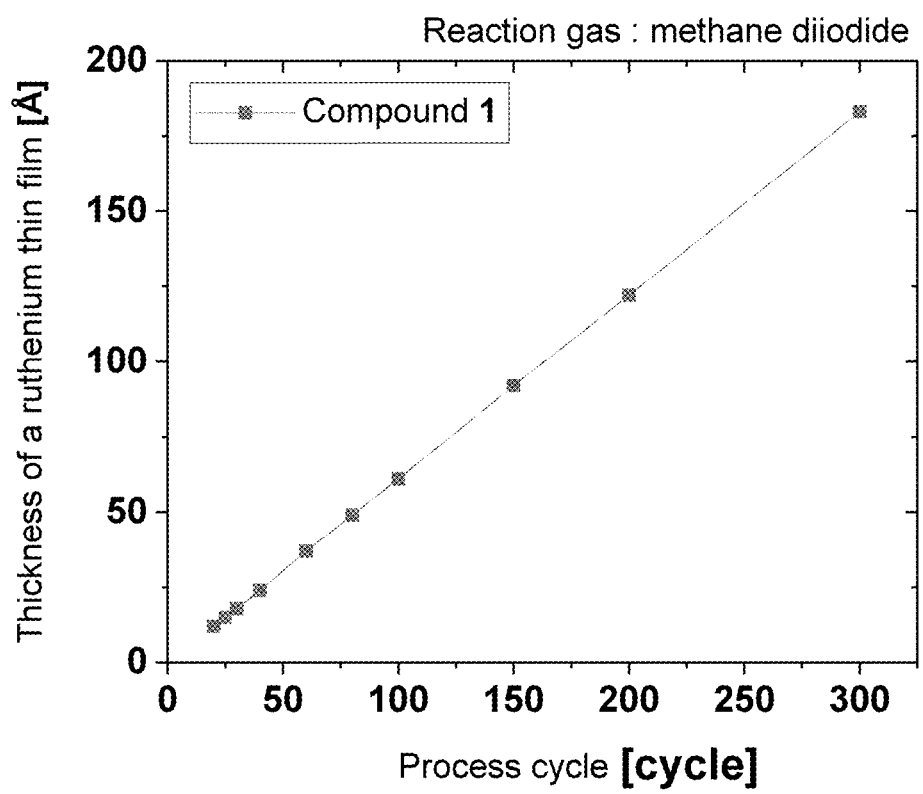
FIG. 10 is a drawing illustrating a thickness of a ruthenium thin film depending on a process cycle in Example 19.

The results of thin film growth for the number of deposition of the ruthenium-containing thin film manufactured in Example 19 are shown in FIG. 10. As shown in FIG. 10, it was confirmed that ruthenium nucleation occurred at 20 cycles or less of the number of deposition, and the ruthenium thin film grew from 20 cycles or more of the number of deposition. In addition, it was confirmed that as the number of depositions is increased, the growth of the ruthenium thin film had a constant slope.

The method of manufacturing a ruthenium-containing thin film of the present invention uses a ruthenium(0)-based hydrocarbon compound as a precursor for depositing a thin film, while using specific reaction gas, that is, iodine, (C1-C3)alkyl iodide, silane iodide, or a mixture thereof as reaction gas, thereby do not including oxygen so that a separate reduction process is not needed, and thus, the ruthenium-containing thin film may be manufactured by a simple process.

In addition, the method of manufacturing a ruthenium-containing thin film of the present invention may produce a thin film having a uniform surface at a thin film thickness of 2 nm or less, and allows a gap-fill without void and a high step coverage.

In addition, the method of manufacturing a ruthenium-containing thin film of the present invention does not use oxygen as reaction gas, but uses iodine, (C1-C3)alkyl iodide, silane iodide, or a mixture thereof, thereby minimizing a content of impurities such as carbon, oxygen and hydrogen, and thus, the thin film has surprisingly excellent purity.

In addition, the method of manufacturing a ruthenium-containing thin film of the present invention may use various ruthenium(0)-based hydrocarbon compounds as a precursor.

In addition, the composition for depositing a ruthenium-containing thin film of the present invention uses a specific compound, that is, iodine, (C1-C3)alkyl iodide, silane iodide, or a mixture thereof as reaction gas, and thus, when the ruthenium-containing thin film is formed using the composition, a high-purity thin film having an excellent step coverage and a gap-fill, and high density may be easily obtained.

The ruthenium-containing thin film manufactured by the manufacturing method according to the present invention may be deposited on a trench, a contact, or a via pattern having a high aspect ratio due to miniaturization of a semiconductor device, with uniform and excellent step coverage.

The invention claimed is:

1. A method of manufacturing a ruthenium-containing thin film, comprising:
   a) maintaining a temperature of a substrate mounted in a chamber to 80 to 500° C.;
   b) injecting carrier gas and a ruthenium(0)-based compound as a precursor for depositing a thin film; and
   c) injecting reaction gas which is iodine, (C1-C3)alkyl iodide, silane iodide, or a mixture thereof to manufacture the ruthenium-containing thin film on the substrate, wherein the ruthenium(0)-based compound is represented by the following Chemical Formula 1-1;

[Chemical Formula 1-1]

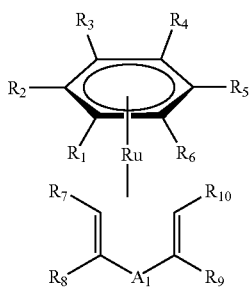

wherein $R_1$ to $R_{10}$ are independently of one another hydrogen or (C1C7)alkyl; and $A_1$ is a single bond or —$(CR_{11}R_{12})_m$— in which $R_{11}$ and $R_{12}$ are independently of each other hydrogen or (C1-C7)alkyl, and m is an integer of 1 to 3;

wherein the method is performed by atomic layer deposition (ALD).

2. The method of manufacturing the ruthenium-containing thin film of claim 1, wherein the reaction gas is used at 0.1 to 200 mol, based on 1 mol of the ruthenium(0)-based compound.

3. The method of manufacturing the ruthenium-containing thin film of claim 1, wherein the method further includes a heat treatment process after the process of c).

4. The method of manufacturing the ruthenium-containing thin film of claim 3, wherein the heat treatment is performed at 200 to 700° C.

5. The method of manufacturing the ruthenium-containing thin film of claim 1, wherein the reaction gas is $I_2$, $CH_3I$, $CH_2I_2$, $CHI_3$, $CH_3CH_2I$, $CH_3CHI_2$, $ICH_2CH_2I$, $CH_3CH_2CH_2I$, $CH_3CHICH_3$, $ICH_2CH_2CH_2I$, or $SiH_2I_2$.

6. The method of manufacturing the ruthenium-containing thin film of claim 1, wherein the carrier gas is any one or a mixture of two or more selected from the group consisting of nitrogen, hydrogen, argon, and helium.

* * * * *

UNITED STATES PATENT AND TRADEMARK OFFICE
CERTIFICATE OF CORRECTION

PATENT NO. : 11,827,650 B2
APPLICATION NO. : 16/760417
DATED : November 28, 2023
INVENTOR(S) : Myong Woon Kim et al.

It is certified that error appears in the above-identified patent and that said Letters Patent is hereby corrected as shown below:

In the Claims

Claim 1

In Column 24, Line 55: replace "A method of manufacturing a ruthenium-containing thin film, comprising:" with "A method of manufacturing a ruthenium-containing thin film by atomic layer deposition (ALD), comprising:".

In Column 24, Line 60: replace "b) injecting carrier gas and a ruthenium(0)-based compound as a precursor for depositing a thin film; and" with "b) injecting carrier gas and a ruthenium(0)-based compound as a precursor for depositing a thin film after step a) above; and".

In Column 24, Line 63: replace "injecting reaction gas which is iodine, (C1-C3)alkyl iodide, silane iodide, or a mixture thereof to manufacture the ruthenium-containing thin film on the substrate, wherein the ruthenium (0)-based compound is represented by the following Chemical Formula 1-1;" with "c) manufacturing a ruthenium-containing thin film on the substrate by injecting reaction gas which is iodine, (C1-C3)alkyl iodide, silane iodide, or a mixture thereof after step b) above, wherein the ruthenium(0)-based compound is represented by the following Chemical Formula 1-1;".

In Column 25, Line 15: Add a "-" between "C1" and "C7".

In Column 25, Line 18: Replace the ";" at the end of the line "and m is an integer of 1 to 3" with a ".".

In Column 25, Line 19: Remove the line "wherein the method is performed by atomic layer deposition (ALD).".

Signed and Sealed this
Ninth Day of April, 2024

Katherine Kelly Vidal
*Director of the United States Patent and Trademark Office*